United States Patent
Marley et al.

(10) Patent No.: US 7,282,376 B2
(45) Date of Patent: Oct. 16, 2007

(54) SYSTEM, METHOD, AND APPARATUS FOR ELECTRICALLY TESTING LEAD-TO-LEAD SHORTING DURING MAGNETORESISTIVE SENSOR FABRICATION

(75) Inventors: Arley Cleveland Marley, San Jose, CA (US); Shawn Marie Collier Hernandez, Gilroy, CA (US)

(73) Assignee: Hitachi Global Storage Technologies Netherlands BV, Amsterdam (NL)

( * ) Notice: Subject to any disclaimer, the term of this patent is extended or adjusted under 35 U.S.C. 154(b) by 336 days.

(21) Appl. No.: 10/975,273

(22) Filed: Oct. 28, 2004

(65) Prior Publication Data

US 2006/0098367 A1    May 11, 2006

(51) Int. Cl.
*H01L 21/00* (2006.01)
(52) U.S. Cl. ...................................... 438/17
(58) Field of Classification Search ............... 438/6, 438/210, 104, 107–114, 118, 121–123, 128–129, 438/135, 142, 145, 149, 151, 157, 176, 478, 438/184, 193, 195–198, 200, 218, 237, 165, 438/294, 308, 337, 353, 378, 401
See application file for complete search history.

(56) References Cited

U.S. PATENT DOCUMENTS

| | | |
|---|---|---|
| 3,681,682 A | 8/1972 | Cox et al. |
| 5,087,884 A | 2/1992 | Brannon |
| 5,457,381 A | 10/1995 | Farwell |
| 5,465,186 A | 11/1995 | Bajorek et al. |
| 5,508,614 A | 4/1996 | Garfunkel et al. |
| 5,589,777 A | 12/1996 | Davis et al. |
| 5,774,291 A | 6/1998 | Contreras et al. |
| 5,991,121 A | 11/1999 | Kanda |
| 6,370,763 B1 | 4/2002 | Watanuki et al. |
| 6,400,534 B1 | 6/2002 | Klaassen |
| 6,411,100 B1 | 6/2002 | Takasu |
| 6,483,298 B2 | 11/2002 | Heim et al. |
| 6,678,127 B2 | 1/2004 | Hsiao et al. |
| 6,718,621 B1 | 4/2004 | Hayashi et al. |
| 2002/0187582 A1* | 12/2002 | Satya et al. ............. 438/48 |
| 2003/0096436 A1* | 5/2003 | Satya et al. ............. 438/11 |
| 2003/0199110 A1* | 10/2003 | Hamamura et al. ........ 438/17 |

FOREIGN PATENT DOCUMENTS

JP          08015360          1/1996

\* cited by examiner

*Primary Examiner*—Michael Lebentritt
*Assistant Examiner*—Andre' Stevenson
(74) *Attorney, Agent, or Firm*—Bracewell & Giuliani LLP

(57) ABSTRACT

Built-in electrical test structures are measured for lead-to-lead shorting during the fabrication of MR elements on a wafer. The test structures are fabricated in the same fashion as the MR elements, however, the active sensor region or track width is omitted from the test structures. Thus, the left and right leads for each test structure are electrically isolated from each other in their "track width" region. If there is lead-to-lead shorting on a test structure, then the left and right leads are electrically connected in the track width region. A simple resistance measurement between the left and right leads determines the extent of any lead shorting by giving a quantitative resistance value.

11 Claims, 3 Drawing Sheets

SYSTEM, METHOD, AND APPARATUS FOR ELECTRICALLY TESTING LEAD-TO-LEAD SHORTING DURING MAGNETORESISTIVE SENSOR FABRICATION

BACKGROUND OF THE INVENTION

1. Technical Field

The present invention relates in general to evaluating magnetoresistive elements and, in particular, to an improved system, method, and apparatus for electrically testing and monitoring lead-to-lead shorting during magnetoresistive sensor fabrication on a wafer.

2. Description of the Related Art

Data access and storage systems generally comprise one or more storage devices that store data on magnetic or optical storage media. For example, a magnetic storage device is known as a direct access storage device (DASD) or a hard disk drive (HDD) and includes one or more disks and a disk controller to manage local operations concerning the disks. The hard disks themselves are usually made of aluminum alloy or a mixture of glass and ceramic, and are covered with a magnetic coating. Typically, one to five disks are stacked vertically on a common spindle that is turned by a disk drive motor at several thousand revolutions per minute (rpm). Hard disk drives have several different typical standard sizes or formats, including server, desktop, mobile (2.5 and 1.8 inches) and microdrive.

A typical HDD also uses an actuator assembly to move magnetoresistive (MR) read/write heads to the desired location on the rotating disk so as to write information to or read data from that location. Within most HDDs, the magnetic read/write head is mounted on a slider. A slider generally serves to mechanically support the head and any electrical connections between the head and the rest of the disk drive system. The slider is aerodynamically shaped to glide over moving air in order to maintain a uniform distance from the surface of the rotating disk, thereby preventing the head from undesirably contacting the disk.

A slider is typically formed with an aerodynamic pattern of protrusions on its air bearing surface (ABS) that enables the slider to fly at a constant height close to the disk during operation of the disk drive. A slider is associated with each side of each disk and flies just over the disk's surface. Each slider is mounted on a suspension to form a head gimbal assembly (HGA). The HGA is then attached to a semi-rigid actuator arm that supports the entire head flying unit. Several semi-rigid arms may be combined to form a single movable unit having either a linear bearing or a rotary pivotal bearing system.

The head and arm assembly is linearly or pivotally moved utilizing a magnet/coil structure that is often called a voice coil motor (VCM). The stator of a VCM is mounted to a base plate or casting on which the spindle is also mounted. The base casting with its spindle, actuator VCM, and internal filtration system is then enclosed with a cover and seal assembly to ensure that no contaminants can enter and adversely affect the reliability of the slider flying over the disk. When current is fed to the motor, the VCM develops force or torque that is substantially proportional to the applied current. The arm acceleration is therefore substantially proportional to the magnitude of the current. As the read/write head approaches a desired track on a disk, a reverse polarity signal is applied to the actuator, causing the signal to act as a brake, and ideally causing the read/write head to stop and settle directly over the desired track.

As HDDs have improved in performance, the widths of the tracks on the MR elements or heads have decreased. This decrease in MR head track width has the inverse effect of increasing the processing complexity of the MR heads. One specific difficulty associated with narrow track widths is an increased likelihood in the formation of an electrical short between the leads of MR heads when they are formed on the wafers. An "electrical bridge" between the leads can degrade head performance by shunting current from the sensor. Therefore, early detection of lead-to-lead shorting provides critical process feedback in terms of yield and cost control.

The conventional technique used to detect MR head lead-to-lead shorting utilizes a top-down scanning electron microscope (SEM) image or photograph of each MR head on a wafer. The drawbacks for using these images to detect lead-to-lead shorting are twofold. First, only the images (i.e., not the heads themselves) are manually inspected to determine if lead-to-lead shorting is present. This inherently provides a merely subjective detection scheme, which can be misinterpreted by the operator. Second, the images cannot tell the operator if a lead-to-lead short is a high resistance short (and, therefore, "unimportant"), or an "important" low resistance short. Thus, it would be desirable to improve the electrical monitoring of lead-to-lead shorting during the wafer fabrication of magnetoresistive sensors.

SUMMARY OF THE INVENTION

One embodiment of a system, method, and apparatus for an electrical test structure that detects and measures lead-to-lead electrical shorting on MR heads fabricated on semiconductor wafers is described. Typically, numerous ones of the test structures are fabricated on a wafer in the same manner as a much larger number of the MR heads. The test structures are interspersed among and virtually identical to the MR heads. However, unlike the MR heads, the active sensors in a track width region of the test structures are omitted. Thus, in one version, the left and right leads of each test structure are electrically isolated from each other in their respective track width regions. If there is a lead-to-lead short on a test structure, the left and right leads are by definition improperly electrically connected in its track width region. A simple resistance measurement between the left and right leads determines (1) if a short exists, and (2) the extent or quantitative value of the short.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Figure 1:
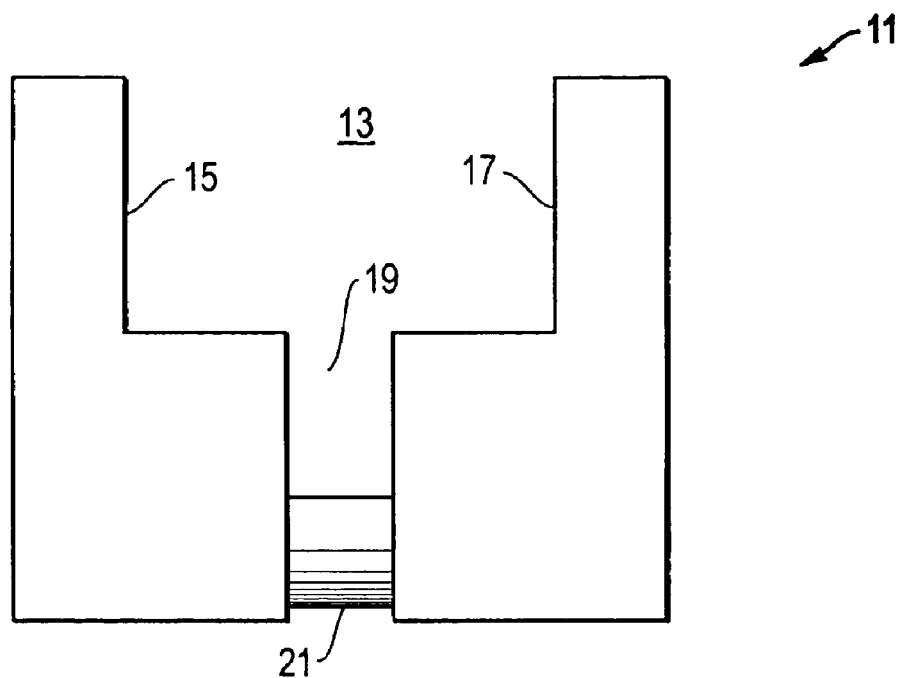
FIG. 1 is a plan view of an unlapped MR element without any lead-to-lead electrical shorting.

Referring to FIGS. 1-4, one embodiment of a system, method, and apparatus for electrically monitoring, testing, and detecting lead-to-lead electrical shorts on a product that is formed on a workpiece is disclosed. For example, the present invention is well suited for detecting and measuring lead-to-lead electrical shorts on magnetoresistive (MR) elements or heads that are fabricated on semiconductor wafers. Typically, thousands of MR heads 11 are formed on a single wafer 13. FIG. 1 is an illustration of one normal, unlapped MR head 11 without any lead-to-lead shorting. The resistance (Rmr) of the unlapped MR head 11 is measured from lead 15 to lead 17. MR head 11 has a sensor region or track width 19 located between leads 15, 17. A sensor 21 spans leads 15, 17 across track width 19.

Figure 2:
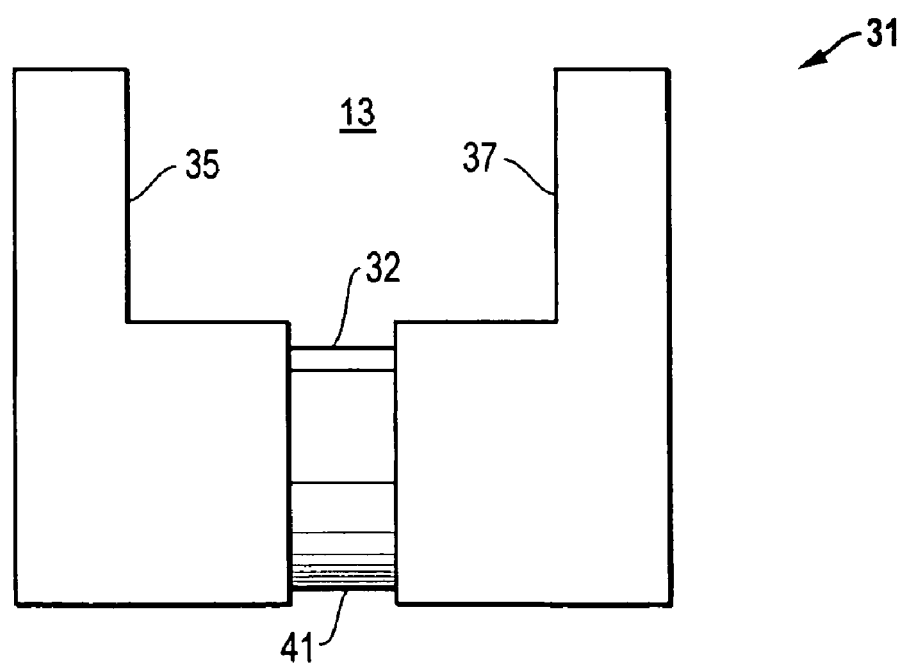
FIG. 2 is a plan view of an unlapped MR element with a lead-to-lead short.

FIG. 2 is an illustration of an abnormal, unlapped MR head 31 with a lead-to-lead electrical short 32 and a sensor 41. MR head 11 is identical to MR head 31, other than the undesirable short 32. Like sensor 41, short 32 spans a track width 39 between a pair of leads 35, 37 on wafer 13. A resistance measurement (Rmr) from lead 35 to lead 37 includes the resistance of the unlapped MR head 31 in parallel with the resistance of the lead-to-lead short 32 (Rsh): $(1/Rtotal)=(1/Rmr)+(1/Rsh)$. Since Rmr is unknown, then Rsh cannot be calculated. Furthermore, if Rsh is much greater than Rmr, then Rtotal~Rmr and the lead-to-lead short 32 will be undetected.

Figure 3:
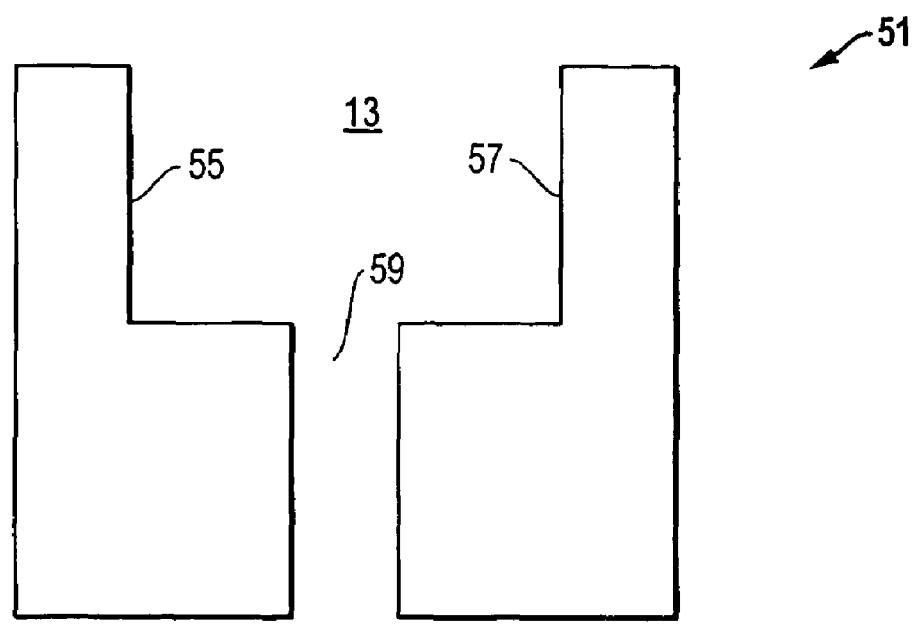
FIG. 3 is a plan view of a test element constructed in accordance with the present invention and is shown without a lead-to-lead short.
Figure 4:
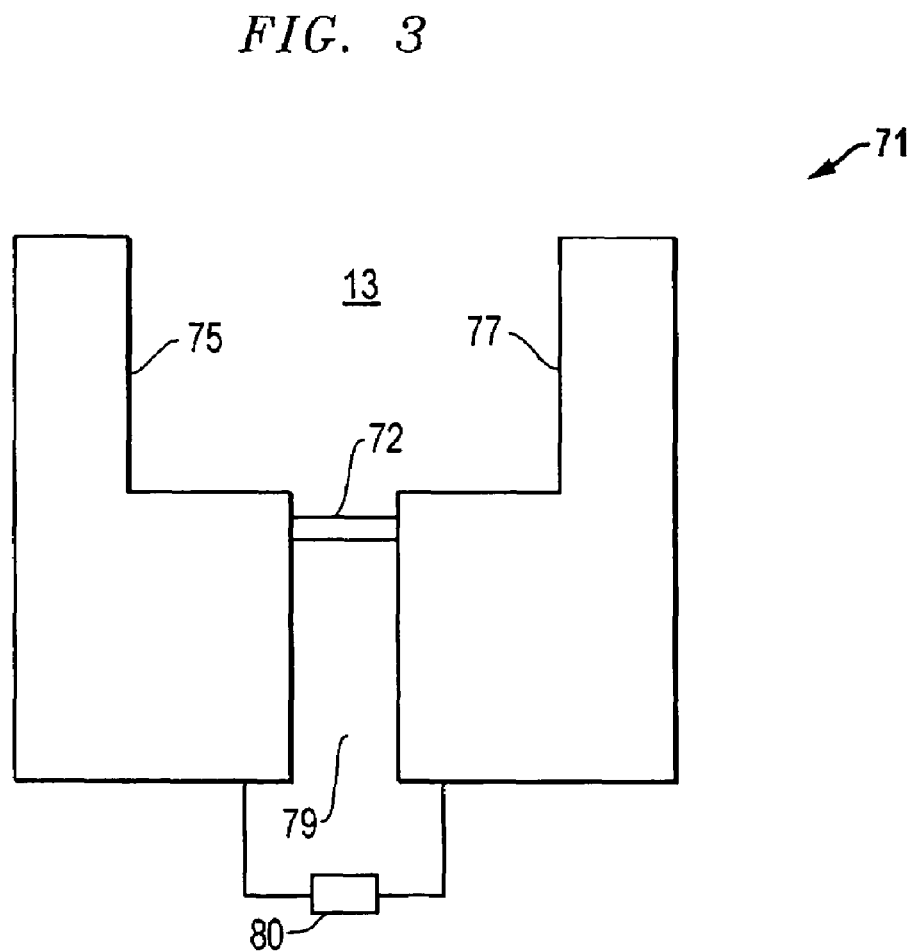
FIG. 4 is a plan view of a test element constructed in accordance with the present invention, but is shown with a lead-to-lead short.

FIG. 3 illustrates one embodiment of a test element 51 on wafer 13 constructed in accordance with the present invention. Test element 51 has no sensor and is shown without a lead-to-lead short. A resistance measurement from lead 55 to lead 57 (across a track width 59) will yield a high resistance value indicating no lead-to-lead shorting. FIG. 4 is an illustration of a test element 71 with a lead-to-lead short 72. Test element 51 is identical to test element 71, other than the undesirable short 72. A resistance measurement from lead 75 to lead 77 will only include the resistance (Rsh) of the lead-to-lead short 72. This test element 71 provides a direct measure of the lead-to-lead short 72.

In a broader sense, one embodiment of the present invention may be characterized as an apparatus for detecting electrical shorts formed during the fabrication of a product on a workpiece or wafer. The apparatus comprises a wafer 13 (FIG. 1) and a plurality of products 11 formed on the wafer 13. Each product 11 has electrical leads 15, 17 that define a space 19 therebetween, and a device 21 that spans the space 19 between the electrical leads 15, 17 that electrically connects the electrical leads 15, 17.

One or more test structures 51 (FIG. 3) are also formed on the wafer 13 with the plurality of products 11. If there is a plurality of the test structures 51, they may be interspersed among the products 11 on the wafer 13. For example, the test structures may number approximately 10 to 200, which may comprise less than 1% of a number of the products 11 (e.g., 25,000 products 11 on one wafer 13). The test structure 51 has test structure electrical leads 55, 57 that define a test structure space 59 therebetween. The test structure 51 is void of a device (e.g., a sensor) that spans the test structure space 59 between the test structure electrical leads 55, 57 so that the test structure electrical leads 55, 57 are electrically isolated.

In the event that an electrical short 72 (FIG. 4) is formed between the test structure electrical leads 55, 57, the short 72 is electrically detectable and quantitatively measurable (e.g., via means 80). Such a short 72 is also an indication that a similar short 32 (FIG. 2) is formed on each of one or more of the products 31. Under these conditions, the workpiece or wafer 13 may be rejected if the electrical short 72 has a relatively low electrical resistance, and the wafer is accepted if the electrical short has a relatively high electrical resistance, as described above.

One embodiment of the present invention also comprises a system for detecting electrical shorts formed during the fabrication of MR heads on semiconductor wafers. The system comprises a semiconductor wafer 13 and a plurality of MR heads 11 formed on the semiconductor wafer 13. Each MR head 13 has a pair of electrical leads 15, 17 that defines a track width 19 therebetween, and a sensor 21 that spans the track width 19 between the electrical leads 15, 17 so that the electrical leads 15, 17 are electrically connected to each other.

At least one test structure 51 is formed on the semiconductor wafer 13 with the plurality of MR heads 13. The test structure 51 has a pair of test structure electrical leads 55, 57 that define a test structure track width 59 therebetween. The test structure 51 is void of a sensor that spans the test structure track width 59 between the test structure electrical leads 55, 57 so that the test structure electrical leads 55, 57 are electrically isolated from each other in the test structure track width 59. Means 80 for electrically detecting and quantitatively measuring an electrical short 72 formed between the test structure electrical leads 55, 57 is also provided and used as described above.

Figure 5:
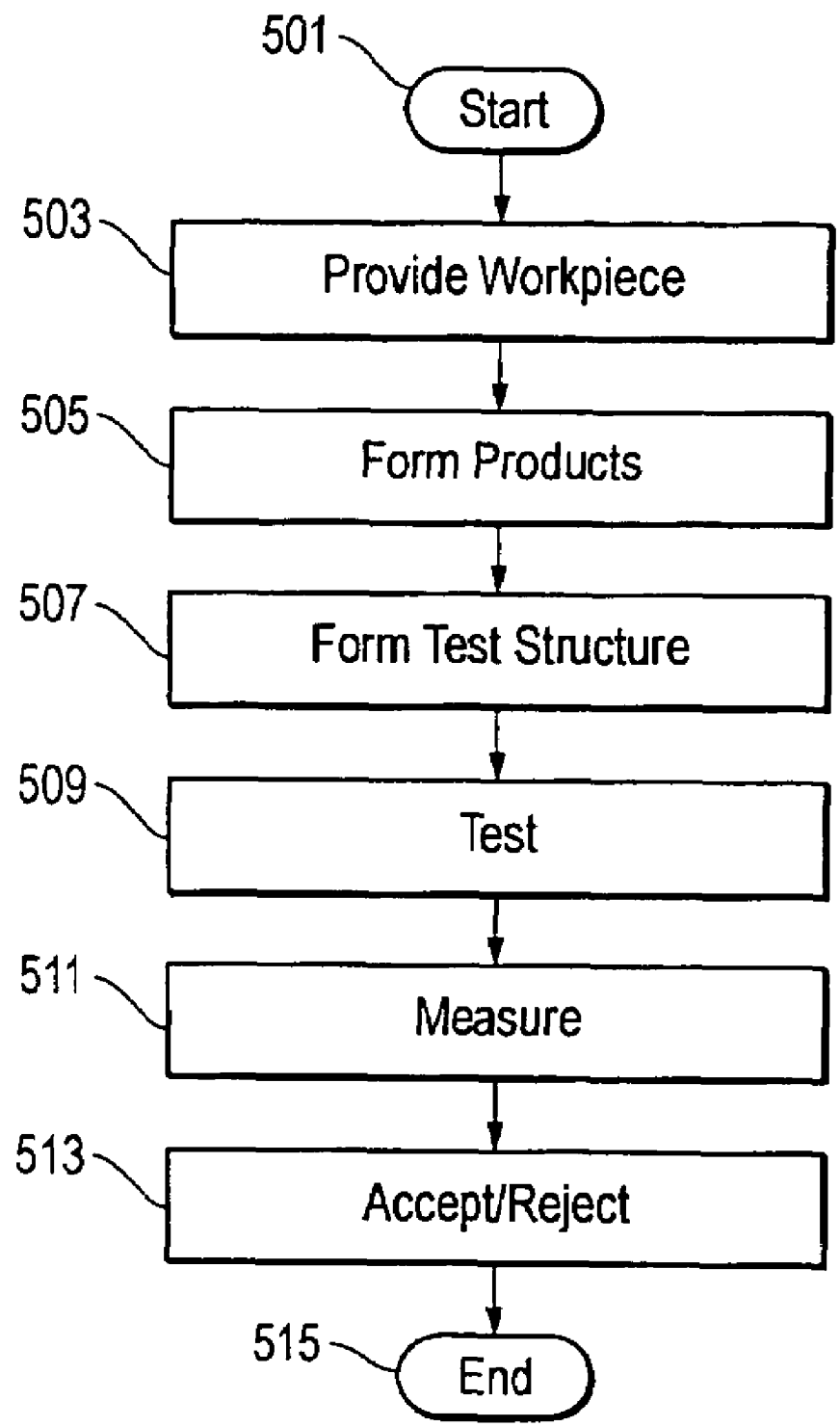
FIG. 5 is a flowchart diagram of one embodiment of a method of the present invention and is constructed in accordance with the present invention.

Referring now to FIG. 5, one embodiment of a method of the present invention constructed in accordance with the present invention is shown. The method detects electrical shorts formed during the fabrication of a product on a wafer. The method starts as indicated at step 501 and comprises providing a workpiece (step 503); forming products on the workpiece (step 505), with each product having electrical leads that define a space therebetween, and a device that spans the space between the electrical leads that electrically connects the electrical leads. The method further comprises forming a test structure on the workpiece (step 507), with the test structure having test structure electrical leads that define a test structure space therebetween; electrically testing the test structure (step 509) to detect if an electrical short is formed between the test structure electrical leads; and, if an electrical short is found between the test structure electrical leads, quantitatively measuring the electrical short (step 511). Steps 505 and 507 (i.e., formation of products and test structures) are preferably performed at the same time during the same process steps so that the test structures have the same lead-to-lead characteristics as the products.

The method also may comprise forming the test structure void of a device that spans the test structure space between the test structure electrical leads so that the test structure electrical leads are electrically isolated. The method may further comprise forming a plurality of test structures, and interspersing the plurality of test structures among the products on the workpiece. The method also may further comprise forming the plurality of test structures at less than 1% of a number of the products, and/or forming the workpiece as a semiconductor wafer, the products as MR heads, the space as a track width, the device as a sensor, and the test structure space as a test structure track width. In addition, the method may further comprise accepting the workpiece (step 513) if the electrical short has a relatively low electrical resistance, and rejecting the workpiece if the electrical short has a relatively high electrical resistance, before ending at step 515.

The present invention has several advantages, including the ability to detect and measure lead-to-lead electrical shorting on MR heads fabricated on semiconductor wafers. If there are lead-to-lead shorts on the test structures, there is a strong probability that the wafer also contains a significant number of MR heads with electrical shorts as well. The present invention also has the advantage of avoiding an accidental rejection of a wafer simply because electrical shorts exist on the test structures. Since the shorts are accurately tested for quantitative values, those shorts having relative high electrical resistance values need not be a cause for rejection of a wafer. Only those test structure shorts having relative low resistance values (i.e., those that degrade the performance of MR heads by shunting current from the sensors) need to be cause for rejection of a wafer.

While the invention has been shown or described in only some of its forms, it should be apparent to those skilled in the art that it is not so limited, but is susceptible to various changes without departing from the scope of the invention.

What is claimed is:

1. A method of detecting electrical shorts formed during the fabrication of MR heads on a semiconductor wafer, the method comprising:
   (a) providing a semiconductor wafer;
   (b) forming MR heads on the semiconductor wafer, each MR head having electrical leads that define a track width therebetween, and a sensor that spans the track width between the electrical leads that electrically connects the electrical leads;
   (c) forming a test structure on the semiconductor wafer, the test structure having test structure electrical leads that define a test structure track width therebetween;
   (d) electrically testing the test structure to detect if an electrical short is formed between the test structure electrical leads; and
   (e) if an electrical short is found between the test structure electrical leads, quantitatively measuring the electrical short.

2. The method of claim 1, wherein step (c) comprises forming the test structure void of a sensor that spans the test structure track width between the test structure electrical leads so that the test structure electrical leads are electrically isolated.

3. The method of claim 1, further comprising forming a plurality of test structures, and interspersing the plurality of test structures among the MR heads on the semiconductor wafer.

4. The method of claim 3, further comprising forming the plurality of test structures at less than 1% of a number of the MR heads.

5. The method of claim 1, further comprising accepting the semiconductor wafer if the electrical short has a relatively low electrical resistance, and rejecting the semiconductor wafer if the electrical short has a relatively high electrical resistance.

6. The method of claim 1, wherein steps (b) and (c) occur at the same time so that the test structure has a same lead-to-lead characteristic as the MR heads.

7. A method of detecting electrical shorts formed during the fabrication of a product on a wafer, the method comprising:
   (a) providing a workpiece;
   (b) forming products on the workpiece, each product having electrical leads that define a space therebetween, and a device that spans the space between the electrical leads that electrically connects the electrical leads;
   (c) forming a plurality of test structures on the workpiece at less than 1% of a number of the products, and interspersing the plurality of test structures among the products on the workpiece, each test structure having test structure electrical leads that define a test structure space therebetween;
   (d) electrically testing the test structures to detect if electrical shorts are formed between the test structure electrical leads; and
   (e) if an electrical short is found, quantitatively measuring the electrical short.

8. The method of claim 7, wherein step (c) comprises forming the test structures void of devices that span the test structure spaces between the test structure electrical leads so that the test structure electrical leads are electrically isolated.

9. The method of claim 7, further comprising forming the workpiece as a semiconductor wafer, the products as MR heads, the spaces as track widths, the devices as sensors, and the test structure spaces as a test structure track widths.

10. The method of claim 7, further comprising accepting the workpiece if the electrical short has a relatively low electrical resistance, and rejecting the workpiece if the electrical short has a relatively high electrical resistance.

11. The method of claim 7, wherein steps (b) and (c) occur at the same time so that the test structures have a same lead-to-lead characteristic as the products.

* * * * *